(12) United States Patent
Hirata et al.

(10) Patent No.: US 6,967,866 B2
(45) Date of Patent: Nov. 22, 2005

(54) SEMICONDUCTOR MEMORY AND SEMICONDUCTOR INTEGRATED CIRCUIT

(75) Inventors: Akio Hirata, Kyoto (JP); Toshiyuki Moriwaki, Osaka (JP); Tetsurou Toubou, Hyogo (JP); Nana Okamoto, Osaka (JP); Mitsuaki Hayashi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/800,711

(22) Filed: Mar. 16, 2004

(65) Prior Publication Data

US 2004/0213029 A1 Oct. 28, 2004

(30) Foreign Application Priority Data

Apr. 23, 2003 (JP) ........................................ 2003-117982

(51) Int. Cl.[7] .............................................. G11C 11/34
(52) U.S. Cl. ........................... 365/177; 365/51; 365/210
(58) Field of Search .......................... 365/177, 51, 210; 257/390, 402

(56) References Cited

U.S. PATENT DOCUMENTS

| 5,468,983 | A | | 11/1995 | Hirase et al. |
| 5,604,365 | A | * | 2/1997 | Kajigaya et al. ............ 257/296 |
| 5,959,877 | A | | 9/1999 | Takahashi |
| 6,376,304 | B1 | * | 4/2002 | Matsuoka et al. .......... 438/253 |
| 6,770,944 | B2 | * | 8/2004 | Nishinohara et al. ....... 257/402 |

FOREIGN PATENT DOCUMENTS

| JP | 2000-195286 A | 7/2000 |
| JP | 2003-17593 A | 1/2003 |

* cited by examiner

*Primary Examiner*—Son T. Dinh
(74) *Attorney, Agent, or Firm*—McDermott Will & Emery LLP

(57) ABSTRACT

A dummy MOSFET including a dummy gate separates nMOSFETs included in adjacent memory cells arranged in the direction in which bit lines extend. This configuration reduces a stress applied from an STI to the channel regions of the nMOSFETs. Accordingly, decrease of drive currents of the nMOSFETs is suppressed.

17 Claims, 12 Drawing Sheets

SEMICONDUCTOR MEMORY AND SEMICONDUCTOR INTEGRATED CIRCUIT

This nonprovisional application claims priority under 35 U.S.C. §119(a) on Japanese Patent Application No. 2003-117982, the entire contents of which are hereby incorporated by reference.

BACKGROUND OF THE INVENTION

The present invention relates to semiconductor memories including mask ROMs having short turn around time (TAT) and required to read data at high speed and also relates to system LSIs including semiconductor memories.

With recent increase in the degree of integration in LSI, system LSIs in each of which systems of electronic devices are incorporated into one LSI have been designed more actively. In such system LSIs, even memories such as a static random access memory (SRAM), a dynamic random access memory (DRAM) and a mask ROM as well as a microcomputer are integrated on one chip. Out of the semiconductor memories, the mask ROM is a nonvolatile read only memory into which data is written using a mask pattern in a fabrication process. Incorporation of this mask ROM into a system LSI requires not only high integration but also short TAT, high-speed accessibility, low power consumption and other features.

As a mask ROM having short TAT, a contact-programming mask ROM is widely used. The contact-programming mask ROM stores "1" or "0" data corresponding to the presence or absence of contact between a bit line and a metal oxide semiconductor field effect transistor (MOSFET) constituting a memory cell. In the contact-programming mask ROM, if a layer including a contact for determining programming is provided at an upper layer, the number of fabrication process steps after the programming can be reduced.

High integration of a mask ROM has been mainly achieved by miniaturization in a fabrication process to date. In the fabrication process for the miniaturized mask ROM, a shallow trench isolation (STI) is used to isolate a MOSFET. However, as the design rule decreases to 0.18 μm or less with the progress of miniaturization, a stress caused by the STI has a greater influence on an n-channel MOSFET (hereinafter, referred to as an nMOSFET). This problem was reported in IEEE 2002 CUSTOM INTEGRATED CIRCUITS CONFERENCE, pp. 24-2-1 to 24-2-4.

FIG. 9 is a graph showing how a stress from an isolation insulating film affects a drive current of an nMOSFET. FIG. 10A is a top plan view showing a MOSFET isolated by an STI. FIG. 10B is a cross-sectional view of the MOSFET shown in FIG. 10A taken along line Xb—Xb. In FIG. 9, the abscissa represents the distance (finger length) from an end of the STI to the channel, and the ordinate represents a saturation current per a unit gate width.

As shown in FIGS. 10A and 10B, a general nMOSFET isolated by an STI includes: a gate insulating film 2008 provided on a semiconductor substrate 2007; a gate electrode 2001 provided on the gate insulating film 2008; sidewalls provided on both sides of the gate insulating film 2008 and the gate electrode 2001; source/drain regions 2002 containing an n-type impurity and defined in the semiconductor substrate 2007 below the both sides of the gate electrode 2001; and contacts 2003 respectively connected to the source/drain regions 2002. A channel 2005 is formed between the source/drain regions 2002 while the MOSFET is driven. The nMOSFET is electrically separated from an adjacent transistor by an STI 2004.

FIG. 9 shows that in such a general nMOSFET the saturation current is substantially constant when the finger length is Lsat or more but decreases sharply as the finger length becomes smaller than Lsat. The saturation current is at the minimum when the finger length is at the minimum (Lmin) determined according to the mask rule. In FIG. 9, the saturation current at the finger, length Lmin is 10% smaller than that at the finger length Lsat.

This change in the characteristics of the MOSFET occurs because thermal expansion of the STI 2004 shown in FIG. 10B in a fabrication process applies a stress 2006 to the channel 2005. In other words, the crystal structure of the channel 2005 is distorted by the stress, and this distortion affects the mobility of a carrier (electrons in the case of an nMOSFET). The stress from the STI is a physical stress, and the influence thereof on the mobility is greater as the distance between the STI 2004 and the channel 2005 is smaller.

By the influence of the stress, the drive current of an nMOSFET in the mask ROM decreases below a theoretical current value. Most of the time required of the mask ROM to read data is the time required of the nMOSFET in the memory cell for releasing the charge used for precharging a parasitic capacitance on a bit line. Accordingly, the decrease of the drive current flowing in the nMOSFET in the memory cell disadvantageously increases the time required of the whole mask ROM to read data.

FIG. 11A is a plan view showing a memory cell region of a semiconductor memory device having a conventional mask ROM. FIG. 11B is a cross-sectional view of the memory cell region of the conventional mask ROM taken along line XIb—XIb.

As shown in FIGS. 11A and 11B, the conventional mask ROM includes: a plurality of word lines 2101 extending in the row direction (lateral direction in FIG. 11A); and a plurality of bit lines 2101 crossing the word lines 2101 and extending in the column direction (vertical direction in FIG. 11A); and a plurality of MOSFETs whose gate electrodes 2104a are connected to the word lines 2101 and which are arranged in a matrix. Among the plurality of MOSFETs, the gate electrodes 2104a of those MOSFETs arranged in the same row are also part of a common gate line 2104. The gate line 2104 is connected to an associated one of the word lines 2101 via a gate contact 2107.

Each of the MOSFETs in the memory cells includes: the gate electrodes 2104a provided on a substrate with gate insulating films interposed therebetween; and source/drain regions (first and second doped layers) 2109 and 2110 formed in the substrate below the sides of the gate electrodes 2104a. The source regions of the MOSFETs arranged in the same row are united, and if the MOSFETs are nMOSFETs, the united source region is connected to a ground line 2103 via a source contact 2106.

As shown in FIG. 11B, an isolation insulating film 2111 is provided between every two adjacent MOSFETs arranged in the same column among the MOSFETs constituting the memory cells. The two adjacent MOSFETs sandwiched between two isolation insulating films share the same n-type doped region as their source regions.

In the conventional mask ROM, one memory cell 2108 is constituted by one nMOSFET. Each MOSFET stores "1" or "0" data corresponding to the presence or absence of connection between the drain region 2110 and the associated bit line 2102 via a drain contact 2105 and a via 2112.

Now, the principle of operation of the conventional mask ROM will be described.

FIG. 12A is an equivalent circuit diagram showing configurations of a memory cell region and a sense amplifier in the conventional mask ROM. FIG. 12B is timing charts showing operation waveforms of respective signals in the conventional mask ROM.

As shown in FIG. 12A, in the periphery of a memory cell region including a plurality of memory cells, a general mask ROM includes: an address decoder 2209 for activating a word line 2101 (see FIG. 11) selected based on address data; a sense amplifier 2203 connected to a bit line 2102 and used for amplifying a readout signal flowing on the bit line to logic levels and outputting a sense amplifier output signal Sout; and an output circuit 2207 for outputting the output from the sense amplifier 2203 to an external circuit.

In the example shown in FIG. 12A, word lines WL0, WL1, WL2, . . . out of the word lines 2101 are respectively connected to the gate electrodes of nMOSFETs 2201a, 2201b, 2201c, . . . out of the nMOSFETs 2201 whose sources are connected to the ground line. The nMOSFETs 2201a and 2201c are both connected to a bit line 2102 (bit line BL) through vias 2112. The nMOSFETs 2201b and 2201d are not connected to the bit line BL. The bit line BL is connected to the sense amplifier 2203 via a column selecting switch 2211 which is an nMOSFET turning ON or OFF according to a column selecting signal CA.

The sense amplifier 2203 includes: a NAND circuit 2213 having a first input port connected to the bit line BL via the column selecting switch 2211 and a second input port receiving the sense amplifier selecting signal SA; a first switch 2206 which is a pMOSFET whose source receives a power-supply voltage and whose drain is connected to the column selecting switch 2211 and the first input port of the NAND circuit 2213; and a second switch 2205 which is a pMOSFET whose source receives a power-supply voltage and whose drain is connected to the column selecting switch 2211 and the first input port of the NAND circuit 2213. The first switch 2206 is controlled with a precharge signal PC input to the gate electrode thereof. The gate electrode of the second switch 2205 is connected to an output port of the NAND circuit 2213.

Now, it will be described how the conventional mask ROM operates with reference to FIG. 12B. In FIG. 12B, the high-level voltages of the respective signals are 1.8 V.

First, the clock signal CK rises, and then the column selection signal CA and the precharge signal PC change to the high level and the low level, respectively. Then, the column selecting switch 2211 and the first switch 2206 turn ON, so that the bit line BL is precharged by the power-supply voltage. In this case, the column selecting signal CA changes to the high level only for the column selecting switch 2211 connected to the selected bit line, so that the unselected bit lines are not precharged. The bit lines are selected depending on the address of data to be read out. During a precharge period before the clock signal CK falls to the low level, the sense amplifier selecting signal SA and the column selecting signal CA are at the high level and the sense amplifier output signal Sout is at the low level. During this period, the output circuit 2207 inverts the output signal Sout to produce an output Out.

Next, the potential on the selected word line WL and the precharge signal PC rise to the high level by the falling edge of the clock signal CK. Then, the precharge period terminates, and the associated nMOSFETs 2201 constituting memory cells turn ON.

At this time, if a memory cell and the bit line BL are connected to each other through the via 2112, the bit line BL is discharged and the sense amplifier output signal Sout changes to the high level. Then, the output Out from the output circuit 2207 changes to the low level.

On the other hand, if the memory cell and the bit line BL is not connected to each other through the via 2112, the potential on the bit line 2102 does not change and the output Out remains at the high level as in the precharge period.

The period in which the clock signal CK falls, the sense amplifier output signal Sout changes to the high level and then the output Out from the output circuit 2207 changes from the high level to the low level will be hereinafter referred to as an "access period".

In this manner, data "0" is stored if the nMOSFETs 2201 and the bit line BL are connected to each other through the vias 2112 (i.e., the output Out is at the low level), whereas data "1" is stored when the nMOSFET 2201 and the bit line BL are not connected to each other (the output Out is at the high level).

In the nMOSFETs 2201 connected to the bit line BL, leakage currents Ileak flow between drain and source even when low-level voltages are applied to the gate electrode thereof. The bit line BL is discharged by these leakage currents Ileak. This is because the conventional mask ROM includes the second switch 2205 within the sense amplifier 2203 in order to keep the potential on the bit line BL at the high level. The size of the second switch 2205 is determined such that the second switch 2205 allows the flow of a current larger than a leakage current Ileak_all that is the sum of the leakage currents flowing in the nMOSFETs 2201 connected to one bit line BL and smaller than the drive currents of the nMOSFETs 2201 when these nMOSFETs 2201 are ON.

In the aforementioned conventional mask ROM, with the reduction of the design rule, stresses from the trench insulating films 2111 provided in the memory cell region are applied to the nMOSFETs, causing a problem of reduction of the drive currents. A solution of the problem is to increase the drive currents of the memory cells.

In U.S. Pat. No. 5,959,877 and Japanese Laid-Open Publication No. 2000-195286, mask ROMs in which gates on word lines have branches were proposed. With this structure, a drive current for an MOSFET constituting a memory cell increases as compared to the conventional general mask ROM shown in FIG. 11.

In Japanese Laid-Open Publication No. 2003-017593, a semiconductor memory in which a ladder type gate is used and the drain of a memory cell is completely surrounded with the gate was disclosed. In this semiconductor memory, the drain of an MOSFET as a memory cell is not necessarily isolated by an STI, so that the current drive capability is not reduced by a stress on the channel caused by the STI. In addition, the drive current per one memory cell is more than three times as large as that in the conventional mask ROM, so that data is read out at higher speed.

SUMMARY OF THE INVENTION

In the mask ROMs disclosed in U.S. Pat. No. 5,959,877 and Japanese Laid-Open Publication No. 2000-195286, the drive current is larger than that in the conventional mask ROM shown in FIG. 11A, but the influence of a stress caused by an STI provided between adjacent nMOSFETs arranged in the direction in which the bit lines extend is observed. That is, in these mask ROMs, an insufficient drive current can be obtained because of the stress from the STI.

On the other hand, in the mask ROM disclosed in Japanese Laid-Open Publication No. 2003-017593, the influence of a stress from an STI is suppressed. However, a parasitic capacitance on a word line is larger than in the conventional mask ROM, so that the leakage current per one memory cell is three times as large as or larger than that in the conventional mask ROM, as is the drive current. Therefore, the mask ROM disclosed in this publication is limited in application.

It is an object of the present invention is to provide a mask ROM in which decrease of a drive current flowing in a memory cell is suppressed and which is capable of operating at high speed.

A semiconductor memory according to the present invention includes: a plurality of word lines; a plurality of bit lines crossing the plurality of word lines; and a plurality of memory cells provided on a semiconductor substrate, each of the memory cells including a MISFET including a first doped layer, a second doped layer and a gate electrode; wherein for first and second memory cells of the plurality of memory cells that are adjacent to each other and arranged in the direction in which the bit lines extend, a first dummy gate electrode connected to a first power supply is provided between a first doped layer of a first MISFET included in the first memory cell and a first doped layer of a second MISFET included in the second memory cell, and the first doped layer of the first MISFET, the first doped layer of the second MISFET and the first dummy gate electrode together constitute a first dummy MISFET which is held OFF during operation.

With this configuration, adjacent MISFETs arranged in the direction in which the bit lines extend can be isolated from each other without using an STI, so that the influence of a stress from the STI is suppressed as compared to conventional semiconductor memories. As a result, the drive current flowing in the memory cells can be increased, thus enhancing the operating speed.

Each of the plurality of memory cells may be constituted by a MISFET, and data may be recorded in accordance with whether or not the first doped layers of the MISFETs constituting the respective memory cells are connected to the bit lines. Then, the inventive semiconductor memory can be used as a ROM exhibiting high-speed read operation.

The MISFETs included in the plurality of memory cells and the first dummy MISFET may be of an n-channel type, and the first power supply may be a ground line. Then, the operating speed is enhanced as compared to a case where the MISFETs are of a p-channel type.

The MISFETs included in the plurality of memory cells and the first dummy MISFET may be of an n-channel type, and the first power supply may be a power supply for supplying a negative voltage. Then, a leakage current flowing in the first dummy MISFET is reduced, so that the decrease of the operating speed is suppressed.

A threshold value of the first dummy MISFET preferably has an absolute value larger than that of a threshold value of each of the MISFETs included in the plurality of memory cells. Then, the leakage current flowing in the first dummy MISFET is reduced.

The first dummy gate electrode preferably has a gate length larger than that of a gate electrode of each of the MISFETs included in the plurality of memory cells. Then, a leakage current flowing in the channel of the first dummy MISFET is reduced, resulting in lower power consumption.

First and second gate insulating films are preferably provided between the gate electrodes of the MISFETs included in the plurality of memory cells and the semiconductor substrate and between the first dummy gate electrode and the semiconductor substrate, respectively, and the second gate insulating film preferably has a thickness larger than that of the first gate insulating film. Then, a leakage current flowing from the first doped layer into the gate electrode via the first gate insulating film is reduced.

Among the MISFETs included in the plurality of memory cells, gate electrodes of those MISFETs arranged in one row in the direction in which the word lines extend may be also part of a common gate line, and the gate line may have a branch extending toward a region interposed between first doped layers of those MISFETs adjacent to each other and arranged in the direction in which the word lines extend, among the MISFETs included in the plurality of memory cells. Then, the cross-sectional area of the first doped layer is increased, so that the potential is stabilized.

The semiconductor substrate may be a partially depleted SOI substrate including: a buried insulating film; and a semiconductor layer provided on the buried insulating film and including first and second doped layers, and a negative voltage may be applied to the semiconductor layer. Then, leakage currents flowing between the memory cells are further reduced, thus enhancing the operating speed.

The inventive semiconductor memory may further include a word line driver including first driver MISFETs of an n-channel type and second driver MISFETs of a p-channel type and used for setting potentials on the plurality of word lines, the first and second driver MISFETs being connected to the plurality of word lines, wherein a second dummy MISFET including a second dummy gate electrode and held OFF during operation is further provided between two of the first driver MISFETs connected to those word lines adjacent to each other among the plurality of word lines. Then, the influence of a stress from an STI is also reduced in the MISFETs in the word line driver. Accordingly, this configuration is effective especially in a case where the operating speed of the word line driver determines the operating speed of the semiconductor memory.

It is preferable that each of the first and second dummy MISFETs is plural in number, and those first and second dummy MISFETs arranged in one row in the direction in which the word lines extend respectively have first and second dummy gate electrodes which are also part of a common dummy gate line. Then, increase of the circuit area is suppressed as compared to a case where the second dummy gate electrode and the dummy gate line are provided separately.

The MISFETs included in the plurality of memory cells and the first dummy MISFET are preferably of an n-channel type, second doped layers of the MISFETs included in the plurality of memory cells and second doped layers of the first driver MISFETs are preferably connected to the first power supply, and the first power supply is preferably a power supply for supplying a negative voltage. Then, the low-level voltage on the word lines can be set at a negative value, so that leakage currents from the memory cells are reduced.

A semiconductor integrated circuit according to the present invention includes: a semiconductor memory comprising a plurality of word lines, a plurality of bit lines crossing the plurality of word lines and a plurality of first memory cells, the first memory cells being provided on a first semiconductor substrate and each including a MISFET including a first doped layer, a second doped layer and a gate electrode; a circuit block including a MISFET provided on a semiconductor substrate and a logic circuit; and a power supply circuit for supplying a fixed potential to at least part of the first semiconductor substrate, wherein for third and fourth memory cells of the plurality of first memory cells that are adjacent to each other and arranged in the direction in which the bit lines extend, a dummy MISFET which includes a dummy gate electrode connected to a first power supply, a third doped layer and a fourth doped layer and is held OFF during operation is provided between a first doped layer of a first MISFET included in the third memory cell and a first doped layer of a second MISFET included in the fourth memory cell.

This configuration is preferable because the operating speed of the semiconductor memory is enhanced as compared to conventional memories.

The circuit block may further include at least one circuit selected from the group consisting of a DRAM, an SRAM and a nonvolatile memory.

The MISFETs included in the plurality of memory cells and the dummy MISFET are preferably of an n-channel type, and the first power supply is preferably a power supply for supplying a negative voltage. Then, a leakage current flowing in the dummy MISFET is reduced.

The power supply circuit preferably supplies a negative voltage to part of the first semiconductor substrate and part of the semiconductor substrate in the circuit block. Then, the circuit area is reduced as compared to a case where a power supply circuits is provided in each circuit.

In the semiconductor integrated circuit, a switch for selecting either one of an output voltage from the power supply circuit or a ground voltage to be supplied to the logic circuit is preferably further provided between the power supply circuit and the logic circuit. Then, during operation, a ground voltage is applied to the substrate so that the threshold voltage of an nMISFET in the logic circuit is relatively reduced for high speed operation. On the other hand, during standby of the logic circuit, a negative potential is applied to the semiconductor substrate so that the threshold voltage is relatively increased and a leakage current is reduced for low power consumption.

DESCRIPTION OF THE PREFERRED EMBODIMENTS

To solve the problems of the prior art techniques, the present inventors tried to eliminate the influence of the stress from the STI by improving fabrication process steps using a method different from those used in prior art. The influence of the stress on MOSFETs was suppressed to some extent, but was not completely eliminated. Therefore, the present inventors changed their approach and examined the structure of a semiconductor memory using no isolation insulating films. As a result, the present inventors came up with the novel idea of using a MOSFET which is always OFF during operation as a "dummy MOSFET" instead of using an isolation insulating film. The term of "dummy MOSFET" is used to distinguish itself from a MOSFET for holding information. Hereinafter, embodiments of the present invention to which the idea is applied will be described.

Embodiment 1

Figure 1A:
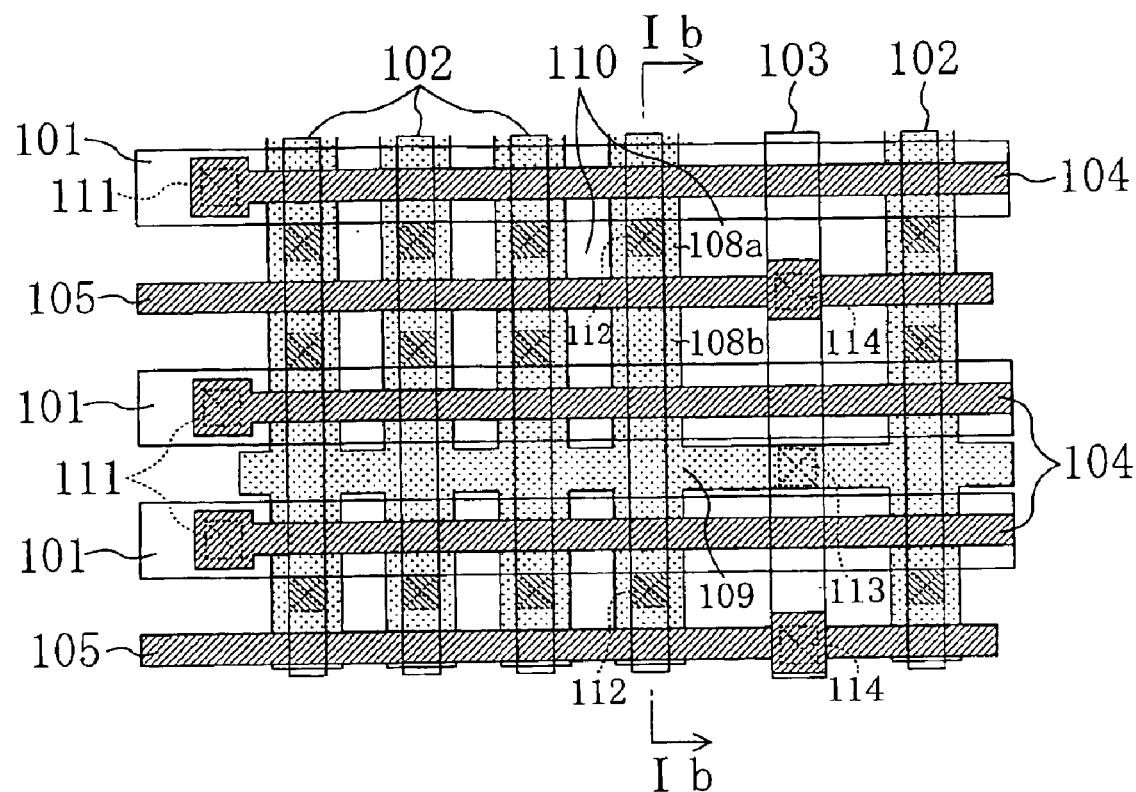
FIG. 1A is a plan view showing a memory cell region of a mask ROM which is a semiconductor memory according to a first embodiment of the present invention.
Figure 1B:
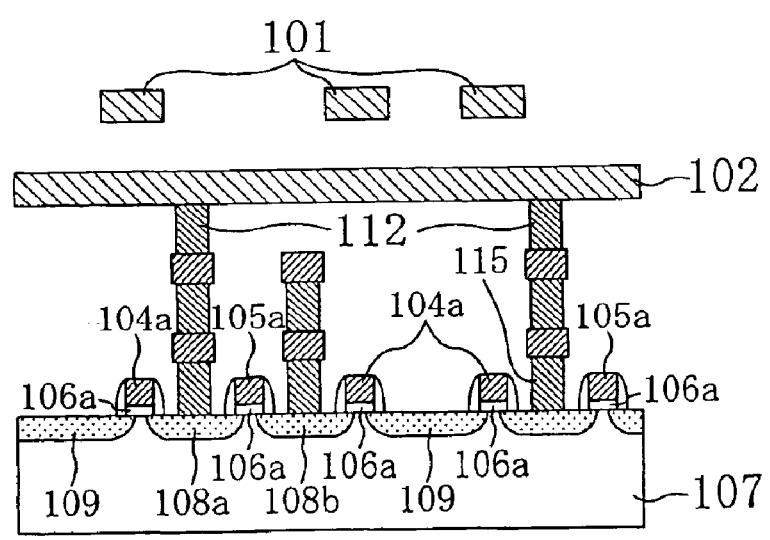
FIG. 1B is a cross-sectional view of the mask ROM shown in FIG. 1A taken along line Ib—Ib.
Figure 2:
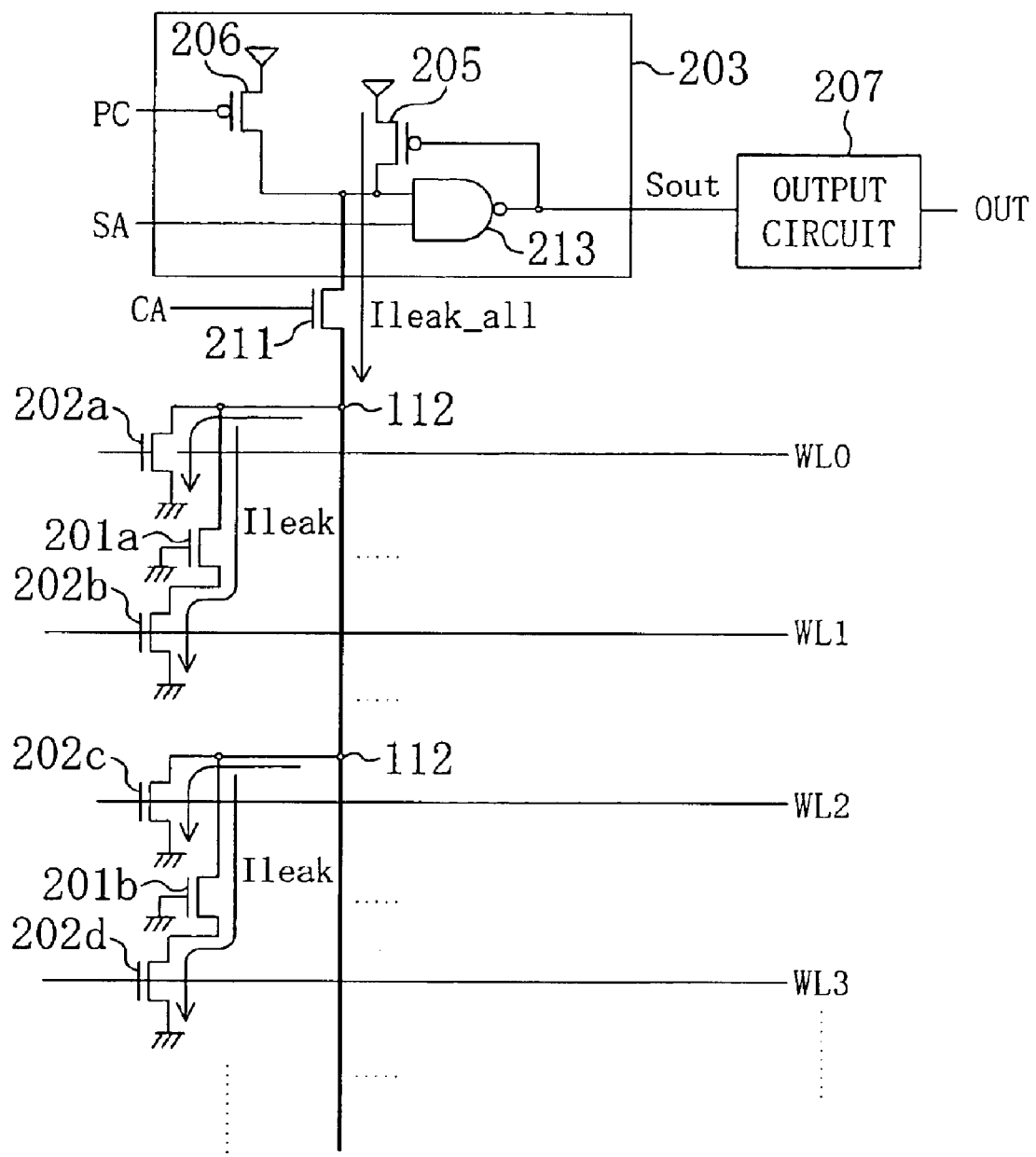
FIG. 2 is an equivalent circuit diagram showing configurations of the memory cell region and a sense amplifier of the mask ROM of the first embodiment.

FIG. 1A is a plan view showing a memory cell region of a mask ROM which is a semiconductor memory according to a first embodiment of the present invention. FIG. 1B is a cross-sectional view of the mask ROM shown in FIG. 1A taken along line Ib—Ib. FIG. 2 is an equivalent circuit diagram showing configurations of the memory cell region and a sense amplifier of the mask ROM of the first embodiment. The mask ROM of this embodiment may be provided singly on a semiconductor chip but is often integrated with a logic circuit and other components to form a memory block of system LSI.

As shown in FIGS. 1A and 1B, the mask ROM of this embodiment includes: a plurality of word lines 101; a plurality of bit lines 102 crossing the word lines 101; a plurality of nMOSFETs whose gate electrodes 104a are connected to the word lines 101 and which are arranged in a matrix; and n-channel dummy MOSFETs each provided between two adjacent MOSFETs arranged in the direction in which the bit lines 102 extend. The dummy MOSFETs are held OFF during operation. In the mask ROM of this embodiment, each of the MOSFETs constitutes a memory cell.

Each of the MOSFETs in the memory cells includes: the gate electrode 104a provided on a semiconductor substrate such as a silicon substrate with a gate insulating film 106a interposed therebetween; and source/drain regions (first and second doped layers) formed in the semiconductor substrate below the sides of the gate electrode 104a. Among the plurality of MOSFETs, the gate electrodes 104a of those MOSFETs arranged in the same row are also part of a common gate line 104. The gate line 104 is connected to the associated word line 101 via a gate contact 111. The source regions of the MOSFETs arranged in the same row are united and, if the MOSFETs are nMOSFETs, the united source region is connected to a ground line 103 via a source contact 113. The drain regions of the MOSFETs arranged in the same row are isolated from each other by an isolation insulating film 110.

On the other hand, each of the dummy MOSFETs includes: a dummy gate electrode 105a provided on the semiconductor substrate with a gate insulating film 106b interposed therebetween; and first and second doped layers formed in the semiconductor substrate below the sides of the dummy gate electrode 105a. Among the plurality of dummy MOSFETs, the dummy gate electrodes 105a of those dummy MOSFETs arranged in the same row are also part of a common dummy gate line 105. The dummy gate line 105 is connected to the ground line 103 via a dummy gate contact 114. In the mask ROM of this embodiment, the dummy gate line 105 extends in the same direction as the word lines 101 and is placed between two gate lines 104. The first and second doped layers of each of the dummy MOSFETs are n-type doped layers which also form the first doped layers of MOSFETs adjacent to the dummy MOSFET in the direction in which the bit lines 102 extend.

In each of the MOSFETs constituting the memory cells, "1" or "0" data is stored corresponding to the presence or absence of connection between the drain region 108 and the bit line 102 via a drain contact 115 and a via 112.

In the cross-section of the mask ROM of this embodiment shown in FIG. 1B, one memory cell (MOSFET), one dummy MOSFET and one memory cell are taken as one unit and this unit is repeatedly arranged. In other words, in the mask ROM of this embodiment, the off-state MOSFETs are used instead of isolation insulating films each provided between adjacent memory cells in the direction in which the bit lines extend in the conventional mask ROM. Accordingly, in the mask ROM of this embodiment, the influence of a stress from an isolation insulating film is reduced, and decrease of readout speed is suppressed.

Now, a configuration of a peripheral circuit of the mask ROM of this embodiment and circuit operation thereof will be described.

As shown in FIG. 2, in the periphery of the memory cell region including a plurality of memory cells, the mask ROM of this embodiment includes: an address decoder (not shown) for activating word lines 101 (see FIG. 1) selected based on address data; a sense amplifier 203 connected to a bit line 102 and used for amplifying a readout signal flowing on the bit line 102 to logic levels and outputting a sense amplifier signal Sout; and an output circuit 207 for outputting the output from the sense amplifier 203 to an external circuit. In FIG. 2, Ileak represents a leakage current flowing in each of the memory cells and Ileak_all represents the sum of leakage currents flowing on the bit line 102.

In the example shown in FIG. 2, word lines WL0, WL1, WL2, WL3, . . . out of the word lines 101 are respectively connected to the gate electrodes of MOSFETs 202a, 202b, 202c, 202d, . . . out of the MOSFETs 202 whose sources are connected to the ground line 103. The MOSFETs 202a and 202c are both connected to the bit line 102 (see FIG. 1) through the via 112. The MOSFETs 202b and 202d are not connected to the bit line 102. Dummy MOSFETs 201a and 201b which are not related to storage operation are provided between the drain regions of the MOSFETs 202a and 202c and between the drain regions of MOSFETs 202c and 202d, respectively.

The bit line 102 is connected to a sense amplifier 203 via a column selecting switch 211 which is an nMOSFET turning ON or OFF based on a column selecting signal CA.

This sense amplifier 203 has the same circuit configuration as that in the conventional mask ROM.

Specifically, the sense amplifier 203 includes: a NAND circuit 213 having a first input port connected to the bit line 102 via the column selecting switch 211 and a second input port receiving a sense amplifier selecting signal SA; a first switch 206 which is a pMOSFET whose source receives a power-supply voltage and whose drain is connected to the column selecting switch 211 and the first input port of the NAND circuit 213; and a second switch 205 which is a pMOSFET whose source receives a power-supply voltage and whose drain is connected to the column selecting switch 211 and the first input port of the NAND circuit 213. The first switch 206 is controlled with a precharge signal PC input to the gate electrode thereof. The gate electrode of the second switch 205 is connected to an output port of the NAND circuit 213.

The mask ROM of this embodiment having the above configuration operates in the same manner as the conventional mask ROM except that the dummy MOSFETs are held OFF.

Specifically, during a precharge period, the first switch 206 is OFF so that the bit line 102 is precharged by a power-supply voltage. Then, in an evaluation period, the first switch 206 turns OFF so that a high-level voltage is applied to the gate electrode of a MOSFET (memory cell) selected based on address data.

At this time, if the selected memory cell and the bit line 102 is connected to each other through the via 112, the bit line 102 is discharged and the sense amplifier output signal Sout changes to a high level. Then, the output Out from the output circuit 207 changes to a low level.

On the other hand, if the memory cell and the bit line 102 is not connected to each other through the via 112, the potential on the bit line 102 does not change and the output Out remains at the high level as in the precharge period.

In the mask ROM of this embodiment having the aforementioned configuration, it is unnecessary to form an STI between adjacent memory cells arranged in the direction in which the bit line 102 extends as described above, so that a problem in which a drive current of an MOSFET decreases due to the influence of a stress from the STI in the bit-line direction is eliminated. Accordingly, it is possible to increase the operating speed of the ROM.

A small leakage current flows in each of the dummy MOSFETs in OFF states. If this leakage current is sufficiently small (e.g., 1 pA or less per one dummy MOSFET), the leakage current does not affect the operation of the ROM.

However, in a case where the leakage currents in the dummy MOSFETs become so large that can no more be disregarded in terms of design, currents flow from the dummy MOSFETs to the ground line via the respective adjacent MOSFETs, resulting in that power consumption may increase. In such a case, if negative voltages are applied to dummy gate electrodes, these leakage currents are suppressed.

The MOSFETs constituting memory cells are preferably nMOSFETs in terms of operating speed, but may be pMOSFETs. In the case of the pMOSFETs, a drive current might increase by a stress from an STI. However, since the influence of the stress from the STI varies, provision of a dummy MOSFET instead of the STI can suppress the variation in performance among memory cells. The dummy MOSFET used in such a case is preferably a pMOSFET which is held OFF.

If leakage currents flowing in the dummy MOSFETs are sufficiently suppressed, the mask ROM is operable even when a voltage higher than 0V and lower than the threshold voltage of the dummy MOSFETs is applied to each of the dummy gate electrodes. However, the leakage currents increase in this case. Therefore, a voltage of 0V or less is preferably applied in general.

The mask ROM of this embodiment can be fabricated with the same number of process steps as for the conventional mask ROM. For example, in the formation of a MOSFET constituting a memory cell, a silicon oxide film and a polysilicon film are deposited over a semiconductor substrate and then gate insulating films 106a and 106b, a gate electrode 104a and a dummy gate electrode 105a are formed by patterning at the same time.

In the foregoing description, the semiconductor memory is a mask ROM. However, the concept of the present invention is also applicable to semiconductor memories such as DRAMs including MOSFETs in memory cells. That is, in DRAMs, the effects described above are also obtained if a dummy MOSFET which is OFF during operation is disposed between MOSFETs in adjacent memory cells arranged in the direction in which bit lines extend.

In the mask ROM of this embodiment, the STI is still provided between adjacent MOSFETS arranged in the direction in which word lines extend. Alternatively, a dummy MOSFET may be provided to replace part of the STI. This eliminates a stress from the STI provided in the direction in which the word lines extend, thus further increasing the operating speed of the mask ROM. It should be noted that the STI cannot be completely removed because the dummy gate should not cross the gate on the word line.

In this embodiment, the MOSFETs are included in the memory cell region and the sense amplifier. Instead of the MOSFETs, MISFETs including gate insulating films other than silicon oxide films may be used. This is applicable to the other embodiments which will be described below.

Embodiment 2

Figure 3A:
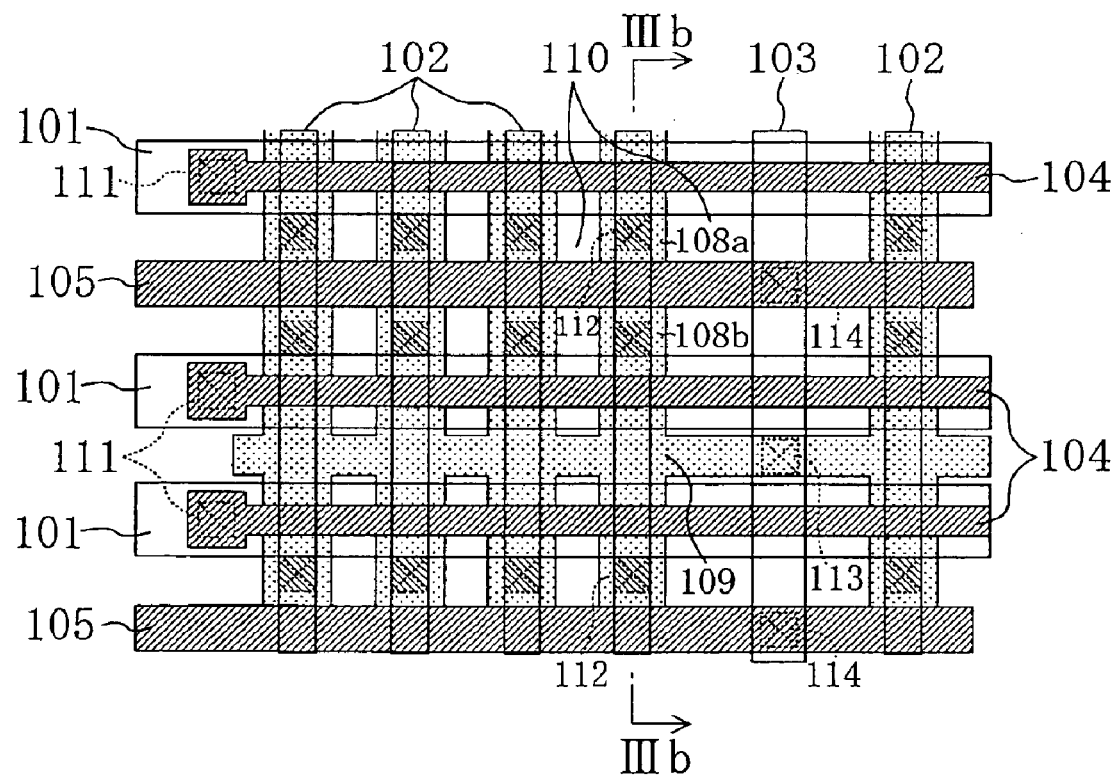
FIG. 3A is a plan view showing a memory cell region of a mask ROM according to a second embodiment of the present invention.
Figure 3B:
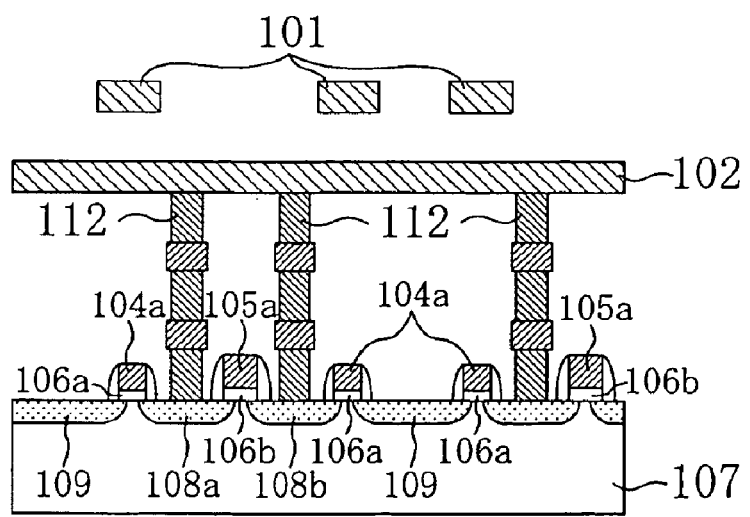
FIG. 3B is a cross-sectional view of the mask ROM shown in FIG. 3A taken along line IIIb—IIIb.

FIG. 3A is a plan view showing a memory cell region of a mask ROM according to a second embodiment of the present invention. FIG. 3B is a cross-sectional view of the mask ROM shown in FIG. 3A taken along line IIIb—IIIb.

The mask ROM of this embodiment is different from the mask ROM of the first embodiment in the following respects.

Firstly, in the mask ROM of this embodiment, the width of dummy gate electrodes 105a and the width (gate length) of dummy gate lines 105 are larger than those of gate electrodes 104a and gate lines 104 of MOSFETs constituting memory cells. In this embodiment, the gate length of the gate electrodes 104a is about 100 nm whereas the gate length of the dummy gate electrodes 105a are about 150 nm.

With this structure, the distance between a first doped layer and a second doped layer of a dummy MOSFET increases, so that a leakage current can be further reduced. Accordingly, in the mask ROM of this embodiment, power consumption can be further reduced, as compared to the mask ROM of the first embodiment.

Secondly, in the mask ROM of this embodiment, the thickness of gate insulating films 106b sandwiched between the dummy gate electrodes 105a and the semiconductor substrate 107 is larger than that of gate insulating films 106a of the MOSFETs constituting the memory cells. For example, if the height of one interconnect layer is about 100 nm, the thickness of the gate insulating films 106a is about 2.6 nm whereas the thickness of the gate insulating films 106b is about 3.5 nm or more or about 10 nm or less. It should be noted that the thicknesses of these gate insulating films vary depending on the height of the interconnect layer and the design rule. The formation of the gate insulating films with different thicknesses on the same semiconductor substrate described above is easily performed by publicly known methods such as double or triple oxidation of the surface of the semiconductor substrate.

With the configuration described above, leakage currents flowing between gate and source in the dummy MOSFETs can be reduced. In addition, a parasitic capacitance caused in a capacitor constituted by the semiconductor substrate, the gate insulating film and the gate electrode can be also reduced. Accordingly, the operating speed of the mask ROM is further enhanced. If the thickness of the gate insulating films 106b increases, the threshold voltage (absolute value) of the dummy MOSFETs increases, so that leakage currents flowing between source and drain are also reduced.

Thirdly, in the mask ROM of this embodiment, the impurity concentration in semiconductor regions (channel regions) directly under the dummy gate electrodes 105a is adjusted such that the threshold voltage of the dummy MOSFETs is higher than that of the MOSFETs constituting memory cells. As the concentration of a p-type impurity in the channel regions is increased, the threshold voltage of the dummy MOSFETs can be set at higher levels.

With this configuration, in a case where the dummy MOSFETs are of an n-channel type, leakage currents are suppressed, thus allowing reduction of the power consumption of the ROM.

In this embodiment, the mask ROM has all the three features described above. However, each of the processes of increasing the width of the dummy gate electrodes 105a, increasing the thickness of the gate insulating films 106b, and adjusting the impurity implantation concentration in the channel regions located directly under the dummy gate electrodes 105a may be performed alone. Even in such cases, the above described effects are achieved.

The configuration of the mask ROM of this embodiment except for the three features described above is the same as that of the mask ROM of the first embodiment, and thus description thereof is herein omitted.

Embodiment 3

Figure 4A:
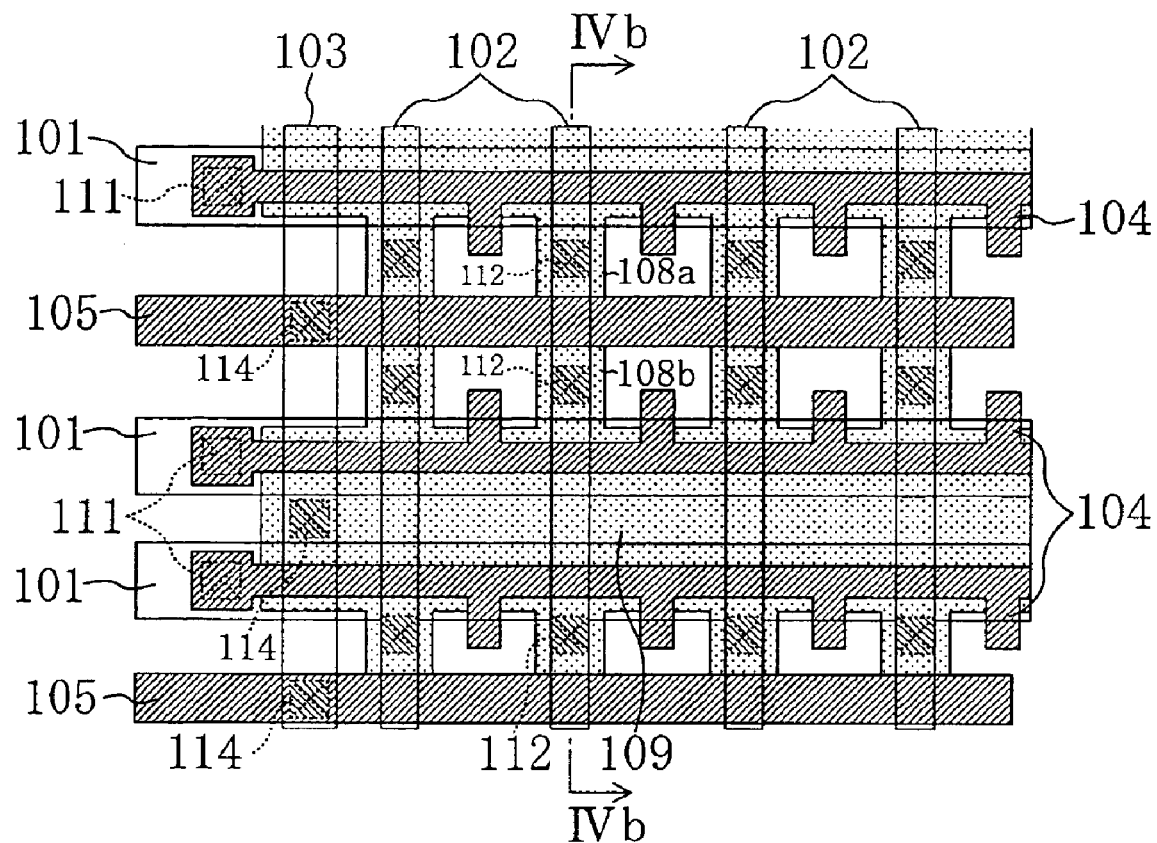
FIG. 4A is a plan view showing a memory cell region of a mask ROM according to a third embodiment of the present invention.
Figure 4B:
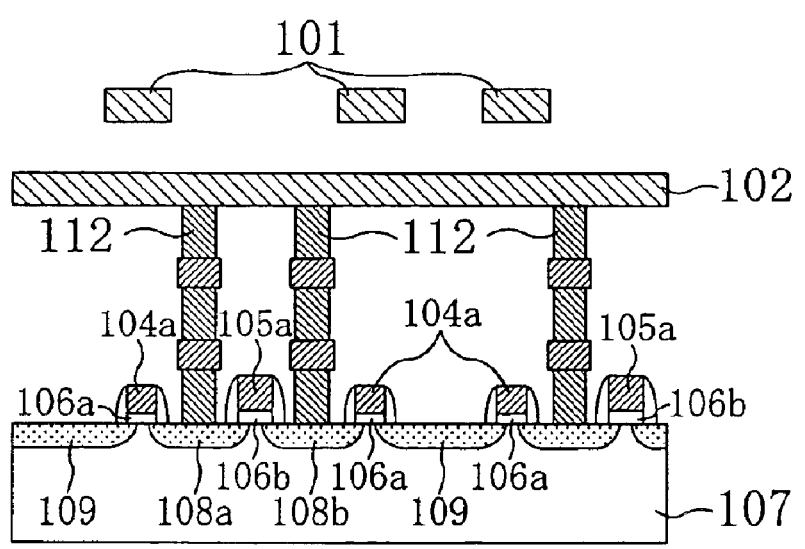
FIG. 4B is a cross-sectional view of the mask ROM shown in FIG. 4A taken along line IVb—IVb.

FIG. 4A is a plan view showing a memory cell region of a mask ROM according to a third embodiment of the present invention. FIG. 4B is a cross-sectional view of the mask ROM shown in FIG. 4A taken along line IVb—IVb.

As shown in FIG. 4A, in the mask ROM of this embodiment, the gate lines 104 in the mask ROM of the second embodiment have branches extending to STIs located between the drain regions of the MOSFETs constituting the memory cells. In the example shown in FIGS. 4A and 4B, the branches extend from the gate lines 104 to the STIs each located between two adjacent MOSFETs arranged in the direction in which the word lines extend. The shapes of the respective components except for the gate lines 104 are the same as those in the mask ROM of the second embodiment.

With this configuration, the cross-sectional area of source regions 109 increases, thus stabilizing a potential fixed as a ground potential.

In addition, in the mask ROM of this embodiment, the effective gate width of the MOSFETs constituting the memory cells increases, so that currents flowing in the memory cells increase and the ROM can operate at higher speed.

If the gate lines of the mask ROM of the first embodiment have the branches as described above, the operating speed of the ROM is also enhanced.

Embodiment 4

Figure 5A:
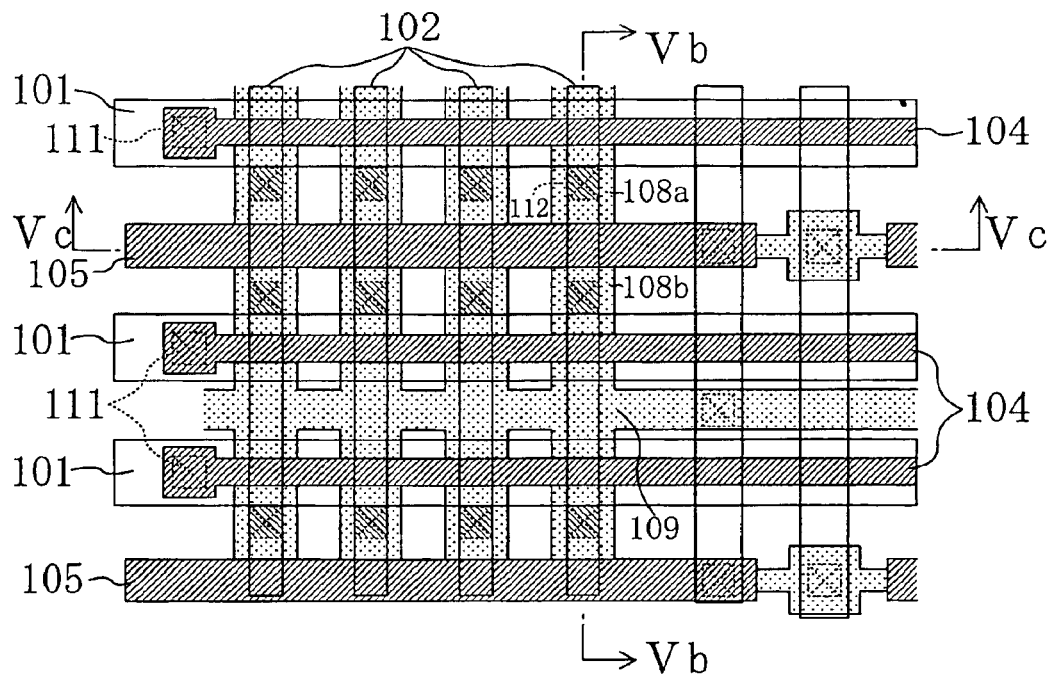
FIG. 5A is a plan view showing a memory cell region of a mask ROM according to a fourth embodiment of the present invention.
Figure 5B:
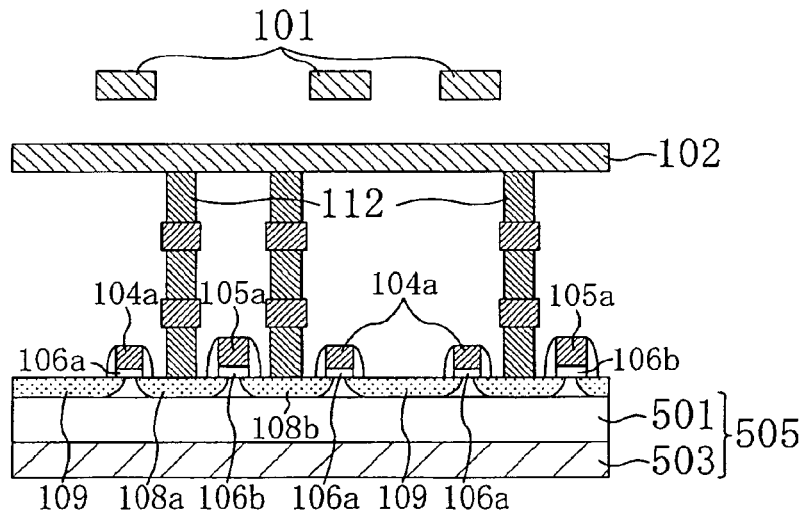
FIG. 5B is a cross-sectional view of the mask ROM shown in FIG. 5A taken along line Vb—Vb.
Figure 5C:
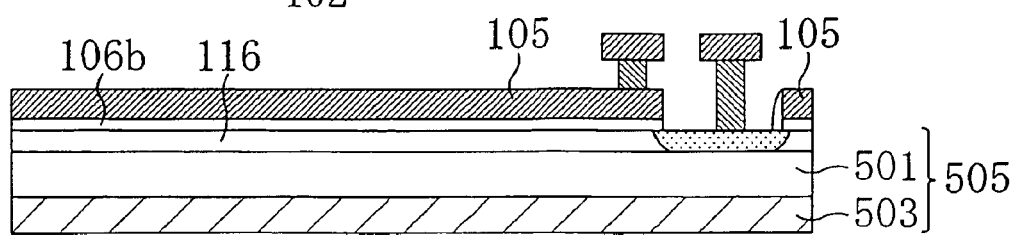
FIG. 5C is a cross-sectional view of the mask ROM shown in FIG. 5A taken along line Vc—Vc.

FIG. 5A is a plan view showing a memory cell region of a mask ROM according to a fourth embodiment of the present invention. FIG. 5B is a cross-sectional view of the mask ROM shown in FIG. 5A taken along line Vb—Vb. FIG. 5C is a cross-sectional view of the mask ROM shown in FIG. 5A taken along line Vc—Vc.

In the mask ROM of this embodiment, the mask ROM of the second embodiment shown in FIGS. 3A and 3B is formed on a partially depleted SOI substrate and a negative potential is applied to a semiconductor region located below dummy gate electrodes 105a.

As shown in FIG. 5B, the mask ROM of this embodiment includes: a substrate 503 made of, for example, silicon; a buried insulating film 501 of $SiO_2$ provided on the substrate 503; and a semiconductor region 116 provided on the buried insulating film 501 and made of, for example, silicon. Source/drain regions 109, 108a and 108b are formed in parts of the semiconductor region 116 located below both sides of gate electrodes 104a and both sides of the dummy gate electrodes 105a. The buried insulating film 501 and the substrate 503 together form the SOI substrate.

As shown in FIG. 5C, the semiconductor region 116 is connected to a negative power source via contact regions containing a p-type impurity and plugs.

By using this SOI substrate, parts of the semiconductor region 116 located below the gate electrodes 104a and parts of the semiconductor region 116 located below the dummy gate electrodes 105a are insulated from each other by the buried insulating film 501 in the mask ROM of this embodiment. Accordingly, it is possible to apply a desired potential to parts of the semiconductor region 116 located below the gate electrode 104a of a MOSFET or parts of the semiconductor region 116 located below the dummy gate electrode 105a of a dummy MOSFET, without affecting parts of the semiconductor region 116 located below the other MOSFETs or the other dummy MOSFETs.

In the mask ROM of this embodiment, a negative potential is applied to the semiconductor region 116 to increase the threshold voltage of the n-channel dummy MOSFETs. Accordingly, leakage currents in the dummy MOSFETs are suppressed and the power consumption is reduced.

Embodiment 5

Figure 6:
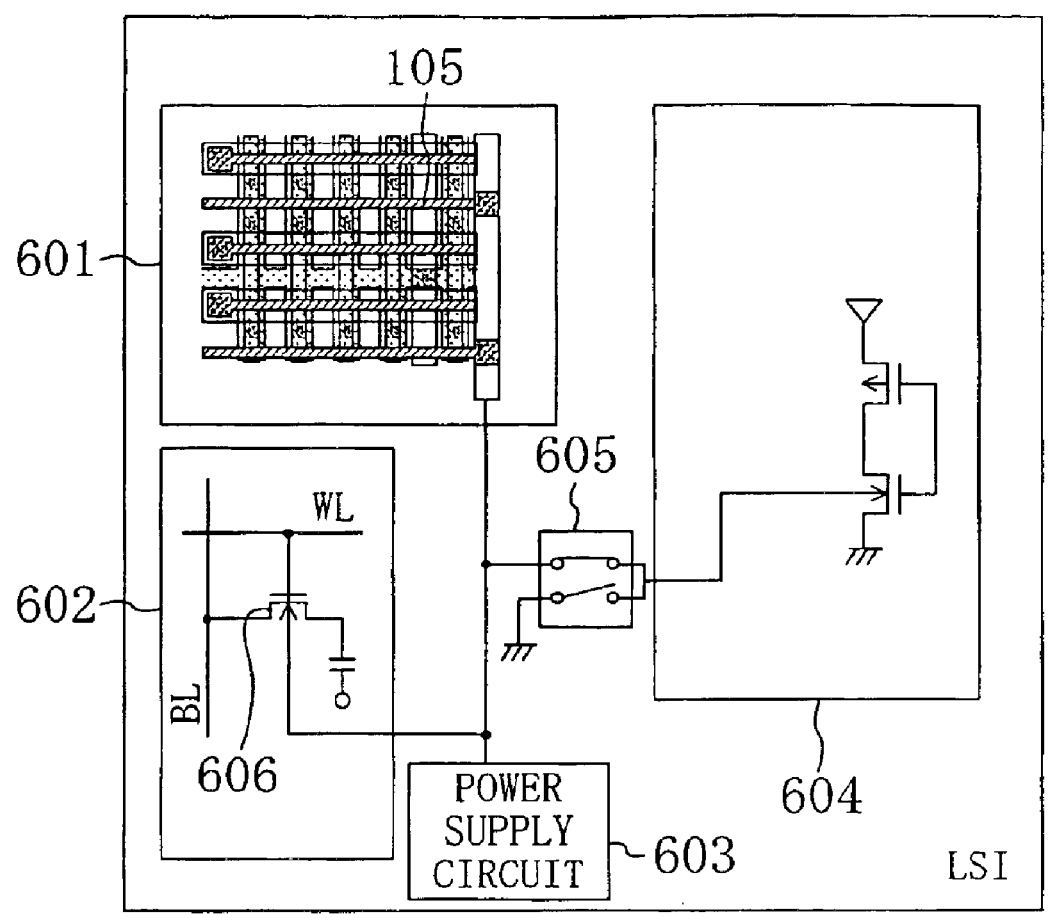
FIG. 6 is a plan view illustrating part of a semiconductor integrated circuit (LSI circuit) according to a fifth embodiment of the present invention.

FIG. 6 is a plan view illustrating part of a semiconductor integrated circuit (LSI circuit) according to a fifth embodiment of the present invention.

In the fifth embodiment, an example of a semiconductor integrated circuit including the mask ROM of, for example, the fourth embodiment will be described.

As shown in FIG. 6, the semiconductor integrated circuit of this embodiment includes: a mask ROM 601; a circuit block including a semiconductor memory and a logic circuit block 604; a power supply circuit 603 for supplying negative voltages to the mask ROM 601, the semiconductor memory and the logic circuit block 604; and a switch 605. The circuit block may be constituted only by the logic circuit block 604 or by the logic circuit block 604 and a nonvolatile memory.

In the semiconductor integrated circuit shown in FIG. 6, a one-transistor one-capacitor (1T1C) DRAM 602 in which each memory cell is constituted by an access transistor 606, which is an nMOSFET, and a capacitor is used as an example of the semiconductor memory. Alternatively, other semiconductor memories such as an SRAM may be used.

As the mask ROM 601, any one of the mask ROMs of the first through fourth embodiments may be used.

In a general DRAM, a negative potential is often applied to the substrate in order to suppress a substrate effect of an access transistor. In an nMOSFETs included in the logic circuit block 604, a negative potential is also applied to the substrate in some cases in order to suppress the substrate effect. Therefore, in the semiconductor integrated circuit of this embodiment, the common power supply circuit 603 supplies negative voltages to dummy gate lines 105 in the mask ROM 601, a substrate region of the access transistor 606 in the DRAM 602 and a substrate region of the nMOSFETs in the logic circuit block, respectively. During operation, in the logic circuit block 604, a ground potential is applied to the substrate of the nMOSFETs so that the threshold voltage is relatively reduced for high speed operation. On the other hand, during standby, a negative potential is applied so that the threshold voltage is relatively increased and a leakage current is reduced for low power consumption. The potential applied to the logic circuit block 604 is switched by the switch 605.

As described above, in the semiconductor integrated circuit of this embodiment, one power supply circuit is shared by a plurality of circuit blocks, so that the number of circuits is reduced and the chip area is also reduced, as compared to a case where power supply circuits are provided to the respective circuit blocks.

In the above example, the power supply circuit 603 for supplying negative voltages is shared by the DRAM 602, the logic circuit block 604 and the mask ROM 601. The number of circuits can be also reduced with another configuration in which the power supply circuit 603 is also shared by another circuit in addition to the components described above.

If the mask ROM 601 is provided on the SOI substrate as shown in FIGS. 5A through 5C and a negative voltage is applied to the semiconductor region, the negative voltage supplied from the power supply circuit 603 may be applied to the semiconductor region.

In the semiconductor integrated circuit of this embodiment, the mask ROM 601, the DRAM 602, the logic circuit block 604 and other components may be formed on the same substrate, or semiconductor chips including respective circuits may be combined.

Embodiment 6

Figure 7A:
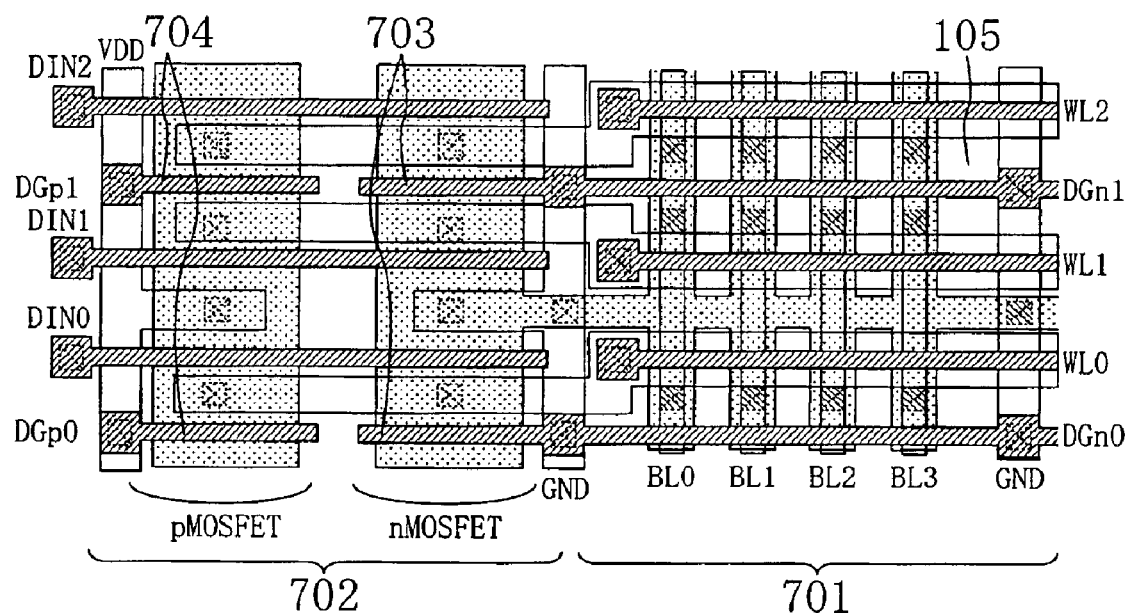
FIG. 7A is a plan view showing a word line driver and a memory cell region in a mask ROM according to a sixth embodiment of the present invention.
Figure 7B:
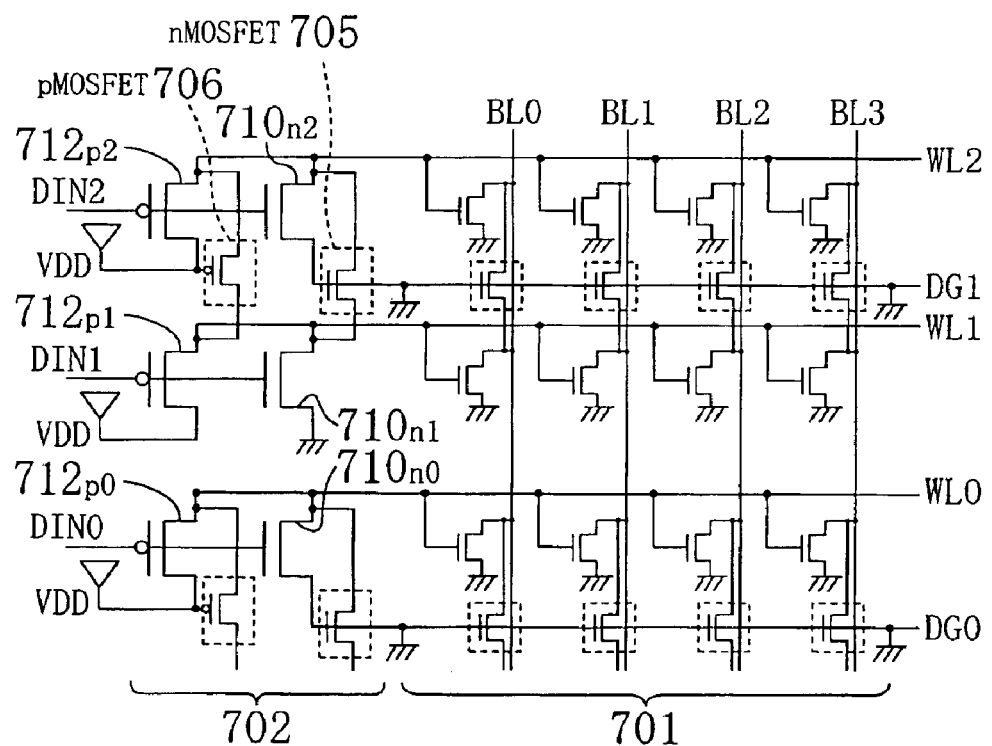
FIG. 7B is a circuit diagram showing configurations of the word line driver and the memory cell region shown in FIG. 7A.

FIG. 7A is a plan view showing a word line driver and a memory cell region in a mask ROM according to a sixth embodiment of the present invention. FIG. 7B is a circuit diagram showing configurations of the word line driver and the memory cell region shown in FIG. 7A. This word line driver 702 is part of an address decoder.

The mask ROM of this embodiment is characterized in that dummy MOSFETs are also provided in the word line driver 702, instead of STIs.

The word line driver 702 applies a high-level voltage to a word line selected based on address data, while applying a low-level voltage to an unselected word line. As shown in FIG. 7B, the word line driver 702 according to this embodiment includes nMOSFETs 710 and pMOSFETs 712, and one of the nMOSFETs 710 and the associated one of the pMOSFETs 712 are connected to the same word line. For example, a word line $WL_0$ is connected to a pMOSFET $712p_0$ and an nMOSFET $710n_0$, and a word line $WL_1$, is connected to a pMOSFET $712p_1$ and an nMOSFET $710n_1$.

The designations of nMOSFET 710 and pMOSFET 712 are used when individual nMOSFETs and individual pMOSFETs are not distinguished from one another. The gate electrodes of the nMOSFETs 710 and the pMOSFETs 712 are connected to each other.

In the word line driver 702, each first in-driver dummy MOSFET 705 of an n-channel type is provided between two adjacent nMOSFETs 710 arranged in the direction in which the bit lines extend (vertical direction in FIG. 7B), and each second in-driver dummy MOSFET 706 of a p-channel type is provided between two adjacent pMOSFETs 712 arranged in the direction in which the bit lines extend.

Dummy gate electrodes 703 of the first in-driver dummy MOSFETs 705 are parts of respective extended dummy gate lines 105 and are connected to a ground line. Accordingly, the first in-driver dummy MOSFETs 705 are always held OFF during operation, and the drain regions of adjacent nMOSFETs 710 arranged in the direction in which the bit lines extend are separated from each other.

Power supply voltages are applied to respective dummy gate electrodes 704 of the second in-driver dummy MOSFETs 706. Accordingly, the second in-driver dummy MOSFETs 706 are always held OFF during operation, and the drain regions of adjacent pMOSFETs 712 arranged in the direction in which the bit lines extend are separated from each other.

With the foregoing configuration, in the MOSFETs in the word line driver 702, a stress from an STI is also reduced as in the MOSFETs included in the memory cells, so that the drive current can increases as compared to the conventional mask ROM, thus allowing increase of the operating speed. In addition, since the current drive capability of the MOSFETs is enhanced, the circuit area can be further reduced.

In particular, if the nMOSFETs 710 in the word line driver 702 are separated from each other by the dummy gate lines extending from a memory cell region 701, the total number of lines for fixing the potentials at the dummy gate electrodes 105a and 703 can be reduced and the chip area is further reduced, as compared to a case where the dummy gate electrodes 703 in the word line driver 702 are separated from the dummy gate electrodes 105a in the memory cell region 701.

In the example described above, the pMOSFETs 712 are individually isolated by dummy MOSFETs as the nMOSFETs 710, but may be individually isolated by STIs as in the conventional mask ROM. In such a case, the effects of the present invention are obtained.

The dummy MOSFETs may be provided only in the word line driver 702. In such a case, it is also possible to increase the operating speed as compared to the conventional mask ROM. However, since the dummy MOSFETs in the memory cell region 701 and the first in-driver dummy MOSFETs 705 can be formed by the same process, dummy MOSFETs are preferably provided in both of the word line driver 702 and the memory cell region 701.

Embodiment 7

Figure 8A:
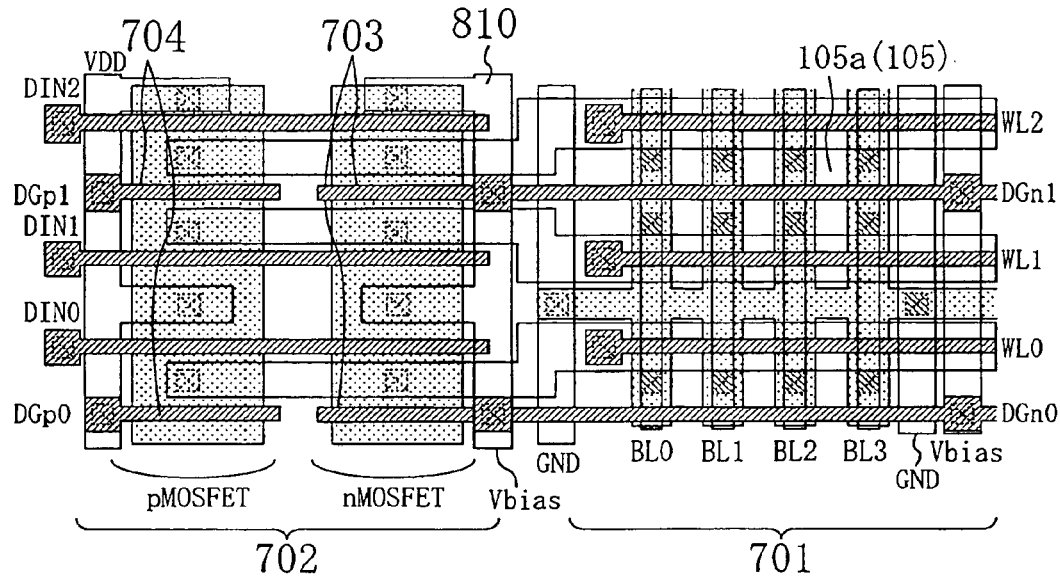
FIG. 8A is a plan view showing a word line driver and a memory cell region in a mask ROM according to a seventh embodiment of the present invention.
Figure 8B:
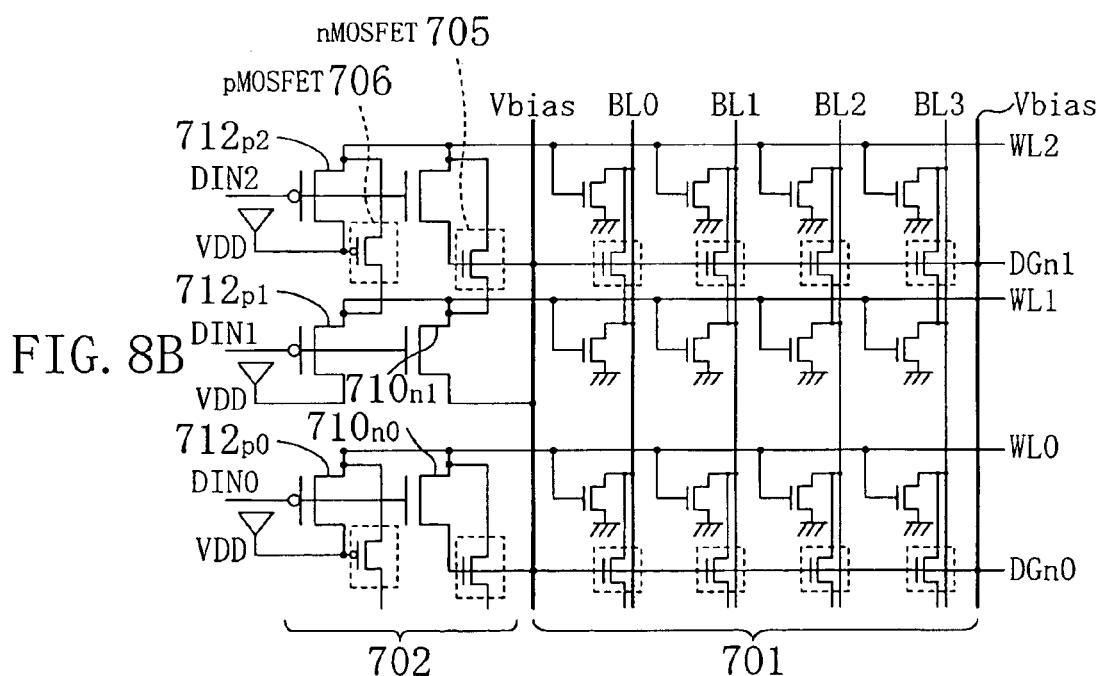
FIG. 8B is a circuit diagram showing configurations of the word line driver and the memory cell region shown in FIG. 8A.
Figure 8C:
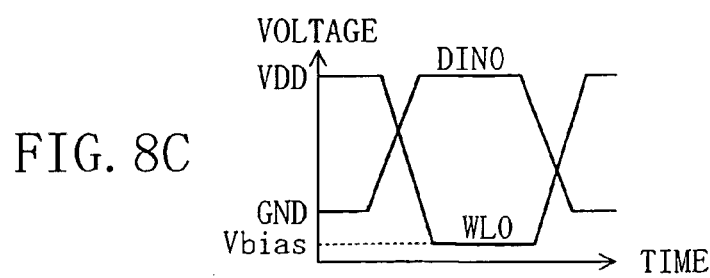
FIG. 8C is a graph showing a change in voltage of a word line in the mask ROM of this embodiment.
Figure 9:
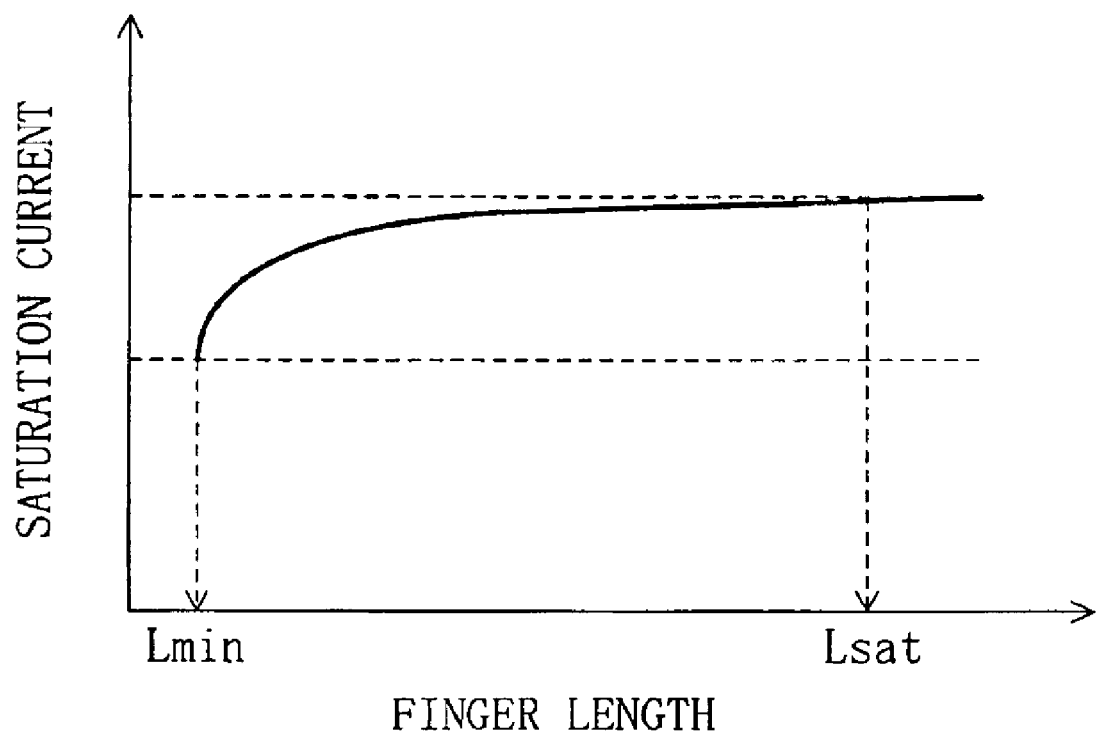
FIG. 9 is a graph showing how a stress from an isolation insulating film affects a drive current of an nMOSFET.
Figure 10A:
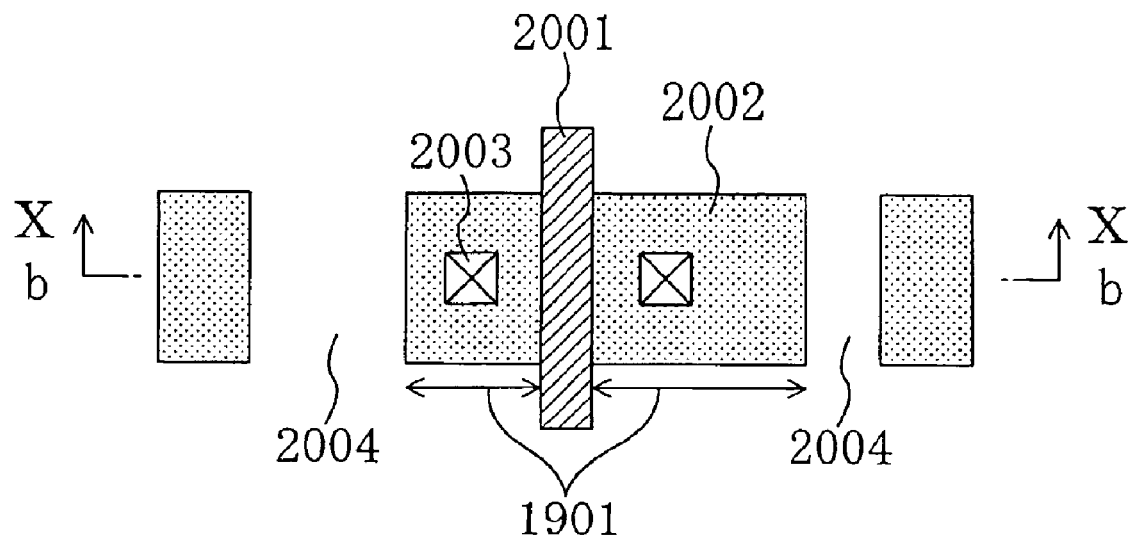
FIG. 10A is a top plan view showing a MOSFET isolated by an STI.
Figure 10B:
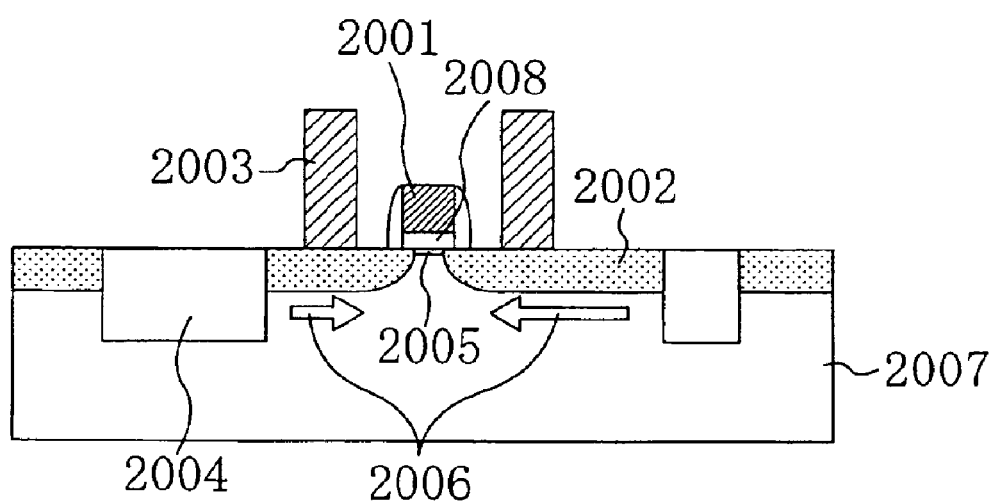
FIG. 10B is a cross-sectional view of the MOSFET shown in FIG. 10A taken along line Xb—Xb.
Figure 11A:
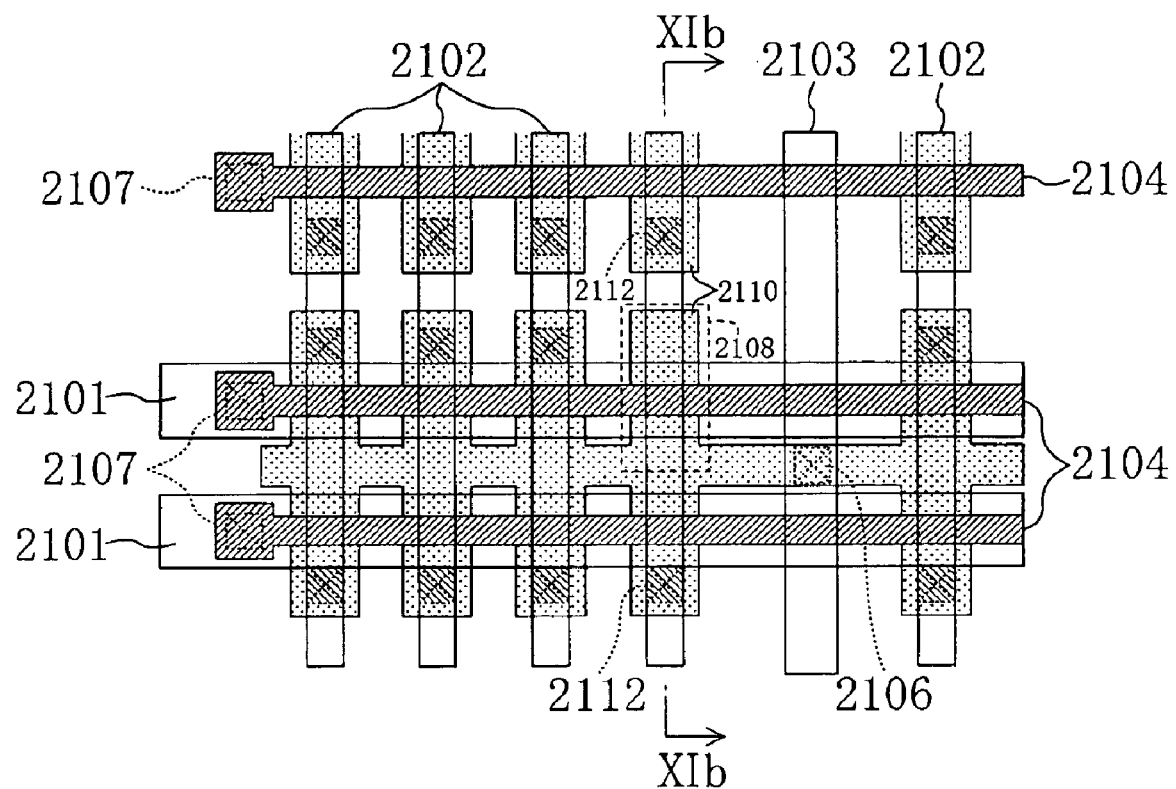
FIG. 11A is a plan view showing a memory cell region of a semiconductor memory device having a conventional mask ROM.
Figure 11B:
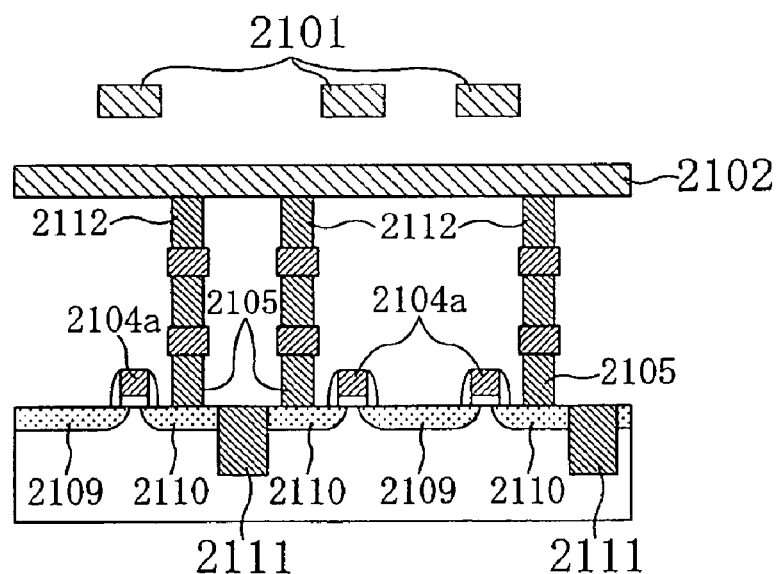
FIG. 11B is a cross-sectional view of the memory cell region of the conventional mask ROM taken along line XIb—XIb.
Figure 12A:
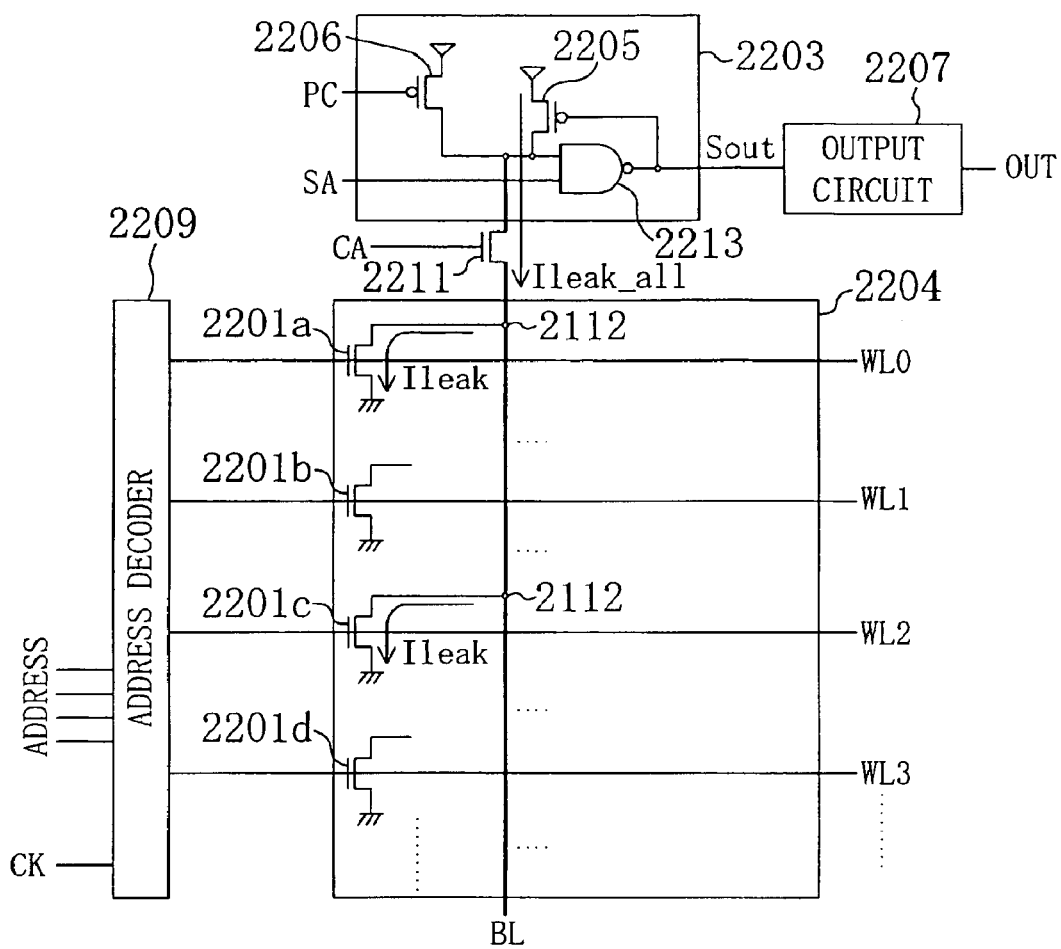
FIG. 12A is an equivalent circuit diagram showing configurations of a memory cell region and a sense amplifier in the conventional mask ROM.
Figure 12B:
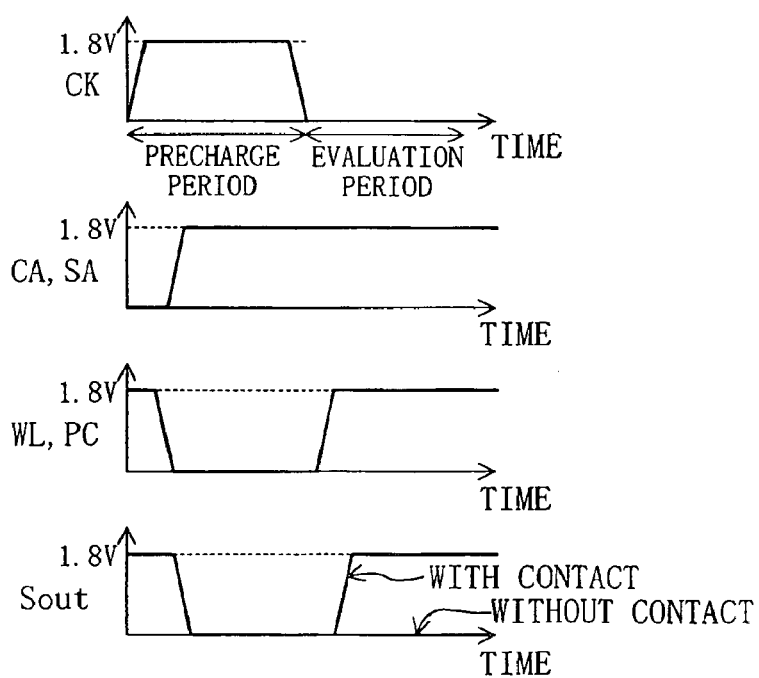
FIG. 12B is timing charts showing operation waveforms of respective signals in the conventional mask ROM.

FIG. 8A is a plan view showing a word line driver and a memory cell region in a mask ROM according to a seventh embodiment of the present invention. FIG. 8B is a circuit diagram showing configurations of the word line driver and the memory cell region shown in FIG. 8A. FIG. 8C is a graph showing a change in voltage on a word line in the mask ROM of this embodiment.

As shown in FIGS. 8A and 8B, the mask ROM of this embodiment has substantially the same configuration as that of the mask ROM of the sixth embodiment, but is different in that the potential at dummy gate electrodes 105a in a memory cell region 701 and the potential at source regions of nMOSFETs 710 in a word line driver 702 are fixed at a potential Vbias, which is lower than a ground potential.

With this configuration, leakage currents flowing in dummy MOSFETs in the memory cell region 701, i.e., leakage currents flowing between drain regions of MOSFETs constituting memory cells, can be further reduced.

In the mask ROM of this embodiment, the potential on a word line changes in the range from the potential Vbias lower than the ground potential to a power-supply potential $V_{DD}$. Accordingly, with respect to MOSFETs whose gate electrodes are connected to an unselected word line in the memory cell region 701, the potential Vbias lower than the ground potential is applied to the gate electrodes, so that leakage currents flowing in the MOSFETs are reduced.

As described above, in the mask ROM of this embodiment, the potential on a word line changes in the range from the potential Vbias lower than the ground potential to the power-supply potential, so that leakage currents flowing while the MOSFETs constituting memory cells are OFF can be reduced. Accordingly, the power consumption of the ROM is reduced.

In addition, in applying the potential Vbias to the sources of the nMOSFETs 710 constituting the word line driver 702, a line 810 for fixing the potentials at the dummy gate electrodes is shared, so that a new line is not needed and thus increase of the chip area is suppressed.

In the example shown in FIGS. 8A through 8C, the dummy gate lines 105 extend to the word line driver region. However, the nMOSFETs 710 in the word line driver region may be isolated from each other by STIs as in the conventional mask ROM. In such a case, the effects of the present invention can be obtained.

The mask ROMs or the semiconductor integrated circuit of the first through seventh embodiments may be implemented individually or may be combined. In both cases, leakage current can be reduced and the operating speed can be enhanced.

What is claimed is:

1. A semiconductor memory comprising:
a plurality of word lines;
a plurality of memory cells provided on a semiconductor substrate, each of the memory cells including a MISFET including a first doped layer, a second doped layer and a gate electrode;
wherein for first and second memory cells of the plurality of memory cells that are adjacent to each other:
a first dummy gate electrode connected to a first power supply is provided between a first doped layer of a first MISFET included in the first memory cell and a first doped layer of a second MISFET included in the second memory cell, and
the first doped layer of the first MISFET, the first doped layer of the second MISFET and the first dummy gate electrode together constitute a first dummy MISFET which is held OFF during operation.

2. The semiconductor memory of claim 1, wherein each of the plurality of memory cells is constituted by a MISFET, and
data is recorded in accordance with whether or not the first doped layer of the MISFET constituting the respective memory cell connected to the bit line.

3. The semiconductor memory of claim 1, wherein the MISFETs included in the plurality of memory cells and the first dummy MISFET are of an n-channel type, and
the first power supply is a ground line.

4. The semiconductor memory of claim 1, wherein the MISFETs included in the plurality of memory cells and the first dummy MISFET are of an n-channel type, and the first power supply is a power supply for supplying a negative voltage.

5. The semiconductor memory of claim 1, wherein a threshold value of the first dummy MISFET has an absolute value larger than that of a threshold value of each of the MISFETs included in the plurality of memory cells.

6. The semiconductor memory of claim 1, wherein the first dummy gate electrode has a gate length larger than that of a gate electrode of each of the MISFETs included in the plurality of memory cells.

7. The semiconductor memory of claim 1, wherein first and second gate insulating films are provided between the gate electrodes of the MISFETs included in the plurality of memory cells and the semiconductor substrate and between the first dummy gate electrode and the semiconductor substrate, respectively, and the second gate insulating film has a thickness larger than that of the first gate insulating film.

8. The semiconductor memory of claim 1, wherein among the MISFETs included in the plurality of memory cells, gate electrodes of those MISFETs arranged in one row in the direction in which the word lines extend are also part of a common gate line, and the gate line has a branch extending toward a region interposed between first doped layers of those MISFETs adjacent to each other and arranged in the direction in which the word lines extend, among the MISFETs included in the plurality of memory cells.

9. The semiconductor memory of claim 1, wherein the semiconductor substrate is a partially depleted SOI substrate including: a buried insulating film; and a semiconductor layer provided on the buried insulating film and including first and second doped layers, and a negative voltage is applied to the semiconductor layer.

10. The semiconductor memory of claim 1, further comprising a word line driver including first driver MISFETs of an n-channel type and second driver MISFETs of a p-channel type and used for setting potentials on the plurality of word lines, the first and second driver MISFETs being connected to the plurality of word lines, wherein a second dummy MISFET including a second dummy gate electrode and held OFF during operation is further provided between two of the first driver MISFETs connected to those word lines adjacent to each other among the plurality of word lines.

11. The semiconductor memory of claim 10, wherein each of the first and second dummy MISFETs is plural in number, and those first and second dummy MISFETs arranged in one row in the direction in which the word lines extend respectively have first and second dummy gate electrodes which are also part of a common dummy gate line.

12. The semiconductor memory of claim 10, wherein the MISFETs included in the plurality of memory cells and the first dummy MISFET are of an n-channel type, second doped layers of the MISFETs included in the plurality of memory cells and second doped layers of the first driver MISFETs are connected to the first power supply, and the first power supply is a power supply for supplying a negative voltage.

13. A semiconductor integrated circuit comprising:

a semiconductor memory comprising a plurality of word lines, a plurality of bit lines crossing the plurality of word lines and a plurality of first memory cells, the first memory cells being provided on a first semiconductor substrate and each including a MISFET including a first doped layer, a second doped layer and a gate electrode;

a circuit block including a MISFET provided on a semiconductor substrate and a logic circuit; and a power supply circuit for supplying a fixed potential to at least part of the first semiconductor substrate, wherein for third and fourth memory cells of the plurality of first memory cells that are adjacent to each other and arranged in the direction in which the bit lines extend, a dummy MISFET which includes a dummy gate electrode connected to a first power supply, a third doped layer and a fourth doped layer and is held OFF during operation is provided between a first doped layer of a first MISFET included in the third memory cell and a first doped layer of a second MISFET included in the fourth memory cell.

14. The semiconductor integrated circuit of claim 13, wherein the circuit block further includes at least one circuit selected from the group consisting of a DRAM, an SRAM and a nonvolatile memory.

15. The semiconductor integrated circuit of claim 13, wherein the MISFETs included in the plurality of memory cells and the dummy MISFET are of an n-channel type, and the first power supply is a power supply for supplying a negative voltage.

16. The semiconductor integrated circuit of claim 15, wherein the power supply circuit supplies a negative voltage to part of the first semiconductor substrate and part of the semiconductor substrate in the circuit block.

17. The semiconductor integrated circuit of claim 16, wherein a switch for selecting either one of an output voltage from the power supply circuit or a ground voltage to be supplied to the logic circuit is further provided between the power supply circuit and the logic circuit.

* * * * *